United States Patent [19]

Katoh

[11] Patent Number: 4,701,956

[45] Date of Patent: Oct. 20, 1987

[54] TONE SIGNAL PROCESSING DEVICE

[75] Inventor: Mitsumi Katoh, Hamamatsu, Japan

[73] Assignee: Nippon Gakki Seizo Kabushiki Kaisha, Hamamatsu, Japan

[21] Appl. No.: 784,860

[22] Filed: Oct. 4, 1985

[30] Foreign Application Priority Data

Oct. 11, 1984 [JP] Japan ............................... 59-211515

[51] Int. Cl.[4] ............................................. H03G 3/00

[52] U.S. Cl. ....................................... 381/61; 381/98; 84/1.19; 84/DIG. 9; 364/723; 364/724

[58] Field of Search ................. 364/723, 724; 84/1.19, 84/DIG. 9; 381/61, 62, 63, 98; 333/166

[56] References Cited

U.S. PATENT DOCUMENTS 4,020,332 4/1977 Crochiere et al. ................. 364/723

*Primary Examiner*—Forester W. Isen

*Attorney, Agent, or Firm*—Spensley Horn Jubas & Lubitz

[57] ABSTRACT

A digital filter is provided between a tone signal generation circuit which supplies a digital tone signal in accordance with a first sampling frequency and a sampling circuit which resamples this digital tone signal in accordance with a second sampling frequency which is lower than the first sampling frequency. This digital filter filters the input digital tone signal with such amplitude-frequency characteristics as to be able to substantially remove an aliasing noise produced due to the second sampling frequency (e.g., with low-pass filter characteristics having a cut-off frequency which is ½ the second sampling frequency). This removes high frequency components producing an aliasing noise from the digital tone signal before it is applied to the resampling circuit whereby generation of the aliasing noise in resampling is prevented. The resampling is performed for adapting the digital tone signal to an operation clock frequency of an effect imparting circuit provided in a posterior stage for imparting, in digital, a tone effect such as a modulation effect to the digital tone signal.

9 Claims, 10 Drawing Figures

TONE SIGNAL PROCESSING DEVICE

BACKGROUND OF THE INVENTION

This invention relates to a tone signal processing device suitable for use in resampling a tone signal which has been sampled once with a sampling frequency of a relatively high rate with a sampling frequency of a lower rate.

An electronic musical instrument which has overcome the problem of an aliasing noise produced in the sampling process by harmonizing the sampling frequency of a tone signal to be generated with the pitch of the tone signal is well known as a pitch synchronous type electronic musical instrument. An example of such pitch synchronous type electronic musical instrument is disclosed in Japanese Preliminary Patent Publication No. 171395/1982 (particularly FIG. 5).

Since in this type of electronic musical instrument the sampling frequency is different for each note, the frequency of a basic sampling clock used commonly for establishing the respective sampling frequencies must be the least common multiple of these sampling frequencies, which naturally becomes a fairly high frequency (e.g., 800 kHz).

The fact that the sampling frequency of a tone signal generated by the pitch synchronous type electronic musical instrument is of a high rate gives rise to the problem that the sampling frequency is too high when this device is applied to a device such as a digital effect device which operates with a clock frequency of a lower rate. Hence an arrangement is made so that a digital tone signal supplied with a high frequency is resampled with a lower rate of frequency and the digital tone signal thus converted to a digital signal of the lower rate frequency is applied to a digital effect circuit. In this arrangement, however, there arises the problem that high frequency components contained in the original tone signal of the high-rate sampling frequency appear as an aliasing noise with respect to the low-rate sampling frequency.

SUMMARY OF THE INVENTION

The tone signal processing device according to the invention comprises tone signal supplying means for supplying a digital tone signal with a high-rate sampling frequency, sampling means for resampling this digital tone signal with a low-rate sampling frequency and a digital filter provided between the tone signal supplying means and the sampling means for filtering the digital tone signal with such filter characteristics as to be able to remove an aliasing noise produced due to the low-rate sampling frequency and supplies the filtered digital tone signal to the sampling means.

According to the invention, the high frequency components which are likely to produce an aliasing noise with respect to the low-rate sampling frequency are removed from a digital tone signal by the digital filter. Accordingly, the problem of the aliasing noise is eliminated in a case where a device using a relatively low clock rate such as a digital effect device is connected to a stage after the sampling means for imparting various tone effects.

An embodiment of the invention will now be described with reference to the accompanying drawings.

BRIEF DESCRIPTION OF THE DRAWINGS

In the accompanying drawings.

DESCRIPTION OF PREFERRED EMBODIMENT

Figure 1:
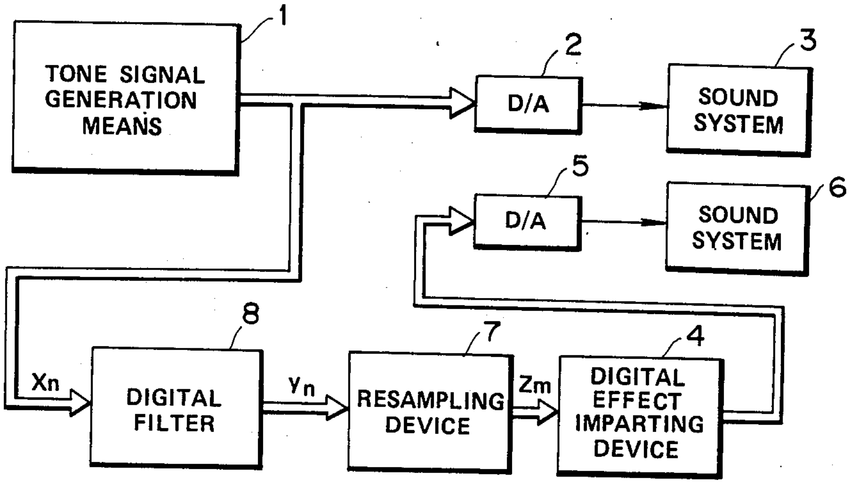
FIG. 1 is an electrical block diagram showing an embodiment of the tone signal processing device according to the invention.

Referring to FIG. 1, tone signal generation means 1 generates tone signals corresponding to respective tone pitches (i.e., note names) in digital according to the pitch synchronizing system. Tones to be generated are designated by a keyboard (not shown) or other suitable means. This tone signal generation means 1 generates one or more digital tone signals of different tone pitches (note names) in a mixed state and, accordingly, the sampling frequency corresponds to the least common multiple of sampling frequencies which are synchronized in pitch with the respective tone pitches when these digital tone signals are viewed as a whole, which sampling frequency therefore is of a fairly high rate (e.g., 800 kHz). For such tone signal generation means 1 of the pitch synchronizing type, the device shown in the above-mentioned Japanese Preliminary Patent Publication No. 171395/1982 or Japanese Patent Application No. 2667/1984 (corresponding to EP No. 85100233.7) can be utilized. A digital tone signal produced by the tone signal generation means 1, i.e. a high-rate sampled wave signal, is supplied to a sound system 3 via a digital-to-analog converter 2 and sounded therefrom.

The digital tone signal provided by the tone signal generation means 1 is supplied also to a system including a digital effect imparting device 4. The digital effect imparting device 4 is a digital circuit for selectively imparting the digital tone signal with effects such as vibrato, chorus, ensemble and reverberation effects. Digital tone signals which are subjects of this digital effect imparting device 4 are of a relatively low-rate sampling frequency (e.g., 50 kHz). For such digital effect imparting device 4, the device shown in Japanese Preliminary Patent Publication No. 50595/1983 (corresponding to U.S. Pat. No. 4,472,993) or other suitable device can be used. The digital tone signal provided by the digital effect imparting device 4 is supplied to a sound system 6 via a digital-to-analog converter 5.

A resampling device 7 is provided between the tone signal generation means 1 and the digital effect imparting device 4 for converting the sampling frequency of the digital tone signal provided by the tone signal generation means 1 from a high-rate one (e.g., 800 kHz) to a low-rate one (e.g., 50 kHz). The digital tone signal which has been resampled with the low-rate sampling frequency in this resampling device 7 thereafter is applied to the digital effect imparting device 4.

A digital filter 8 is provided between the tone signal generation means 1 and the resampling device 7. This digital filter 8 filters the digital tone signal which are subjected to a high-rate sampling frequency with such filter characteristics as to be able to substantially remove an aliasing noise with respect to the low-rate sampling frequency (e.g., 50 kHz). As will be apparent from the sampling theorem, the aliasing noise occurs in the frequency region over $\frac{1}{2}$ of the sampling frequency so that the filter characteristics of the digital filter 8 should preferably be set to a low-pass filter with a cutoff frequency equivalent to one half the low-rate sampling frequency for removing the aliasing noise.

A specific example of the device will be described hereunder on the assumption that the high-rate sampling frequency of 800 kHz and the low-rate sampling frequency of 50 kHz are used.

A sample value of the digital tone signal of the high-rate sampling frequency provided by the tone signal generation means 1 is designated by $x_n$. The suffix n represents a sample point number in one cycle of the tone signal which, by way of example, is any one of 0 through 63. A sample value of the digital tone signal provided by the digital filter 8 is designated by $y_n$. By way of example, the digital filter 8 is composed of an FIR filter (finite impulse response filter) of 64 stages having the following transfer function:

$$y_n = \sum_{i=0}^{63} h_i x_{n-i} \quad (1)$$

A sample value of the digital tone signal provided by the resampling device 7 is designated by $Z_m$. Since resampling device 7 converts the high sampling rate of 800 kHz to the low sampling rate of 50 kHz, the filter output signal $y_n$ corresponding to the digital tone signal $x_n$ sampled at the high sampling rate is resampled every 16 sample points. Accordingly, $Z_m = y_{16n}$.

Figure 2:
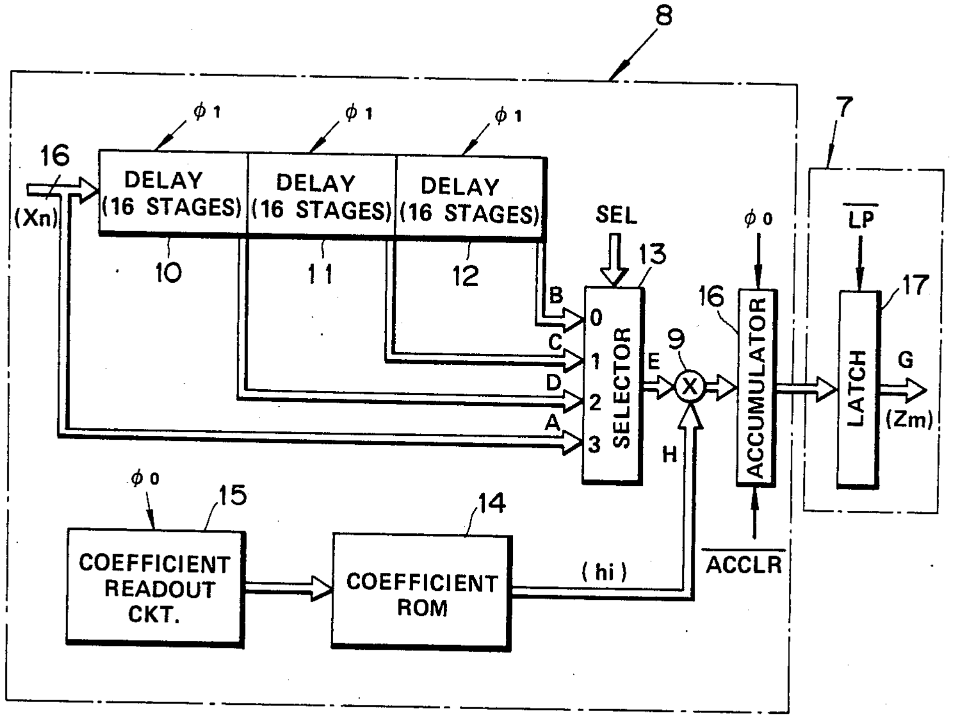
FIG. 2 is a block diagram showing the digital filter and the resampling device in FIG. 1 in detail.
Figure 3:
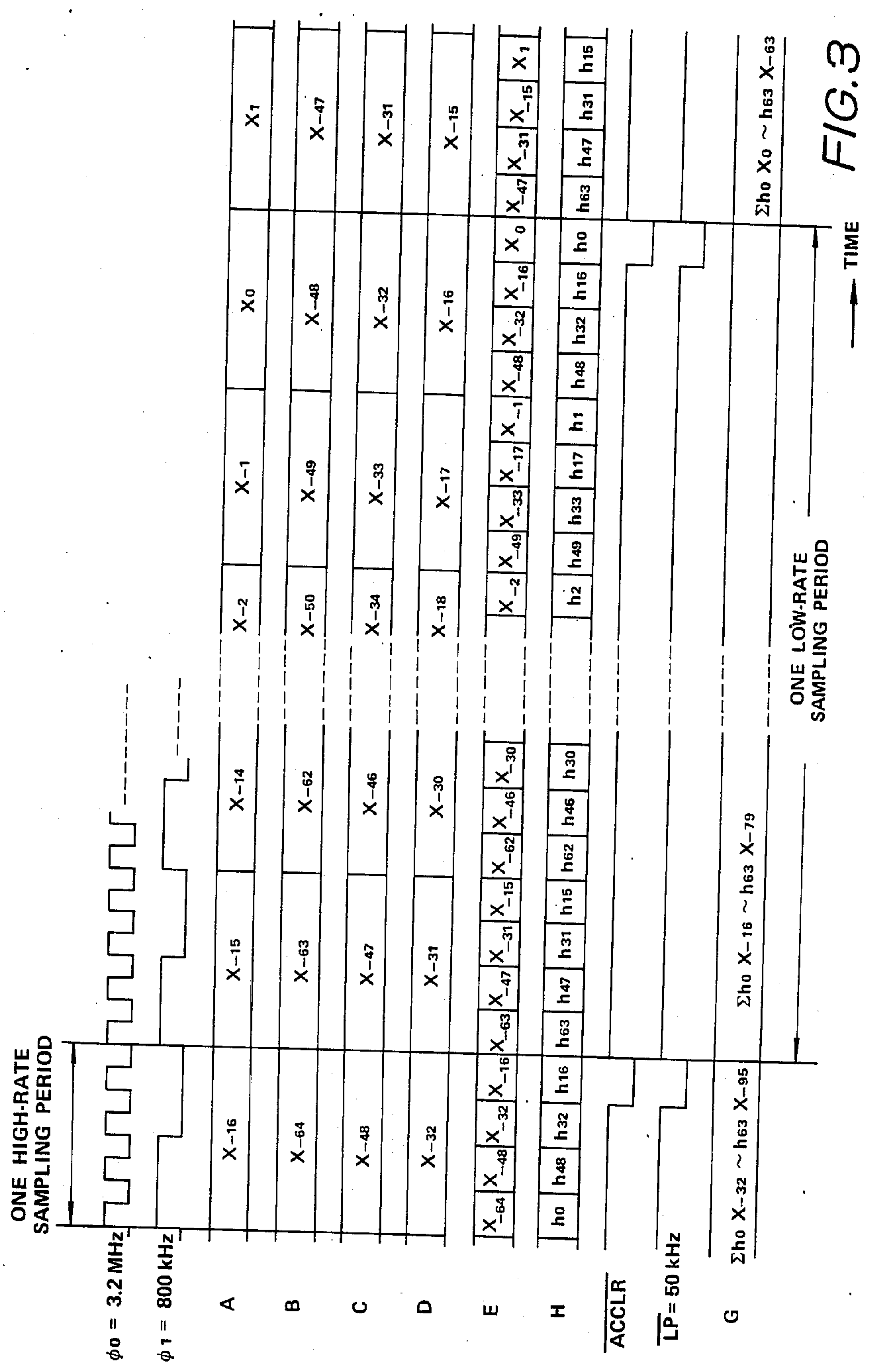
FIG. 3 is a time chart showing an example of signals appearing in some parts of the circuit of FIG. 2.

FIG. 2 shows a specific example of the digital filter 8 and the resampling device 7. The digital filter 8 employs a single multiplier 9 on a time shared basis for multiplying filter coefficient $h_i$ of each stage (i=0 to 63). Delay circuits 10, 11 and 12 each having 16 stages are cascade-connected. The delaying operation of these delay circuits are controlled with a sampling clock pulse synchronized with the high-rate sampling frequency of 800 kHz. The digital tone signal $x_n$ supplied in 16-bit parallel is applied to the first stage of the first delay circuit 10 and sequentially delayed by the sampling clock pulse $\phi_1$ in synchronism with the high-rate sampling period. The digital tone signal $x_n$ which has not been delayed is applied to a "3" input of a selector 13, the output of the delay circuit 10 which has been delayed by 16 sampling periods is applied to a "2" input thereof, the output of the delay circuit 11 which has been delayed by 32 sampling periods is applied to a "1" input thereof and the output of the delay circuit 12 which has been delayed by 48 sampling periods is applied to a "0" input thereof. To a select control input of the selector 13 is applied a selection signal SEL. As shown in FIG. 3, this selection signal SEL successively changes between four states of "0" to "3" during one high-rate sampling period thereby successively selecting sample values of the digital tone signal applied to the "0"-"3" inputs. The state of the selection signal SEL changes in accordance with a clock pulse $\phi_0$ having a frequency of 3.2 MHz which is four times as high as the high-rate sampling frequency.

Thus, the sample value $x_n$ is selected by the selector 13 in a skipping manner every 16 sample points in accordance with the period of the clock pulse $\phi_0$ and applied to the multiplier 9. The multiplier 9 receives at other input thereof a filter coefficient $h_i$ read out from a coefficient ROM 14. A coefficient readout circuit 15 operates in response to the clock pulse $\phi_0$ thereby designating the order i of the coefficient $h_i$ to be read out at each period. The coefficient ROM 14 provides a coefficient $h_i$ of the order i which has been designated by the coefficient readout circuit 15.

In the foregoing manner, each term $h_i x_{n-i}$ of the above formula (1) is sequentially calculated every period of the clock pulse $\phi_0$ in the multiplier 9. An accumulator 16 accumulates values of the respective terms $h_i x_{n-i}$ supplied from the multiplier 9 in accordance with the clock pulse $\phi_0$ to obtain the sum y of the series of the formula (1). Since i=0 to 63, the sum $y_n$ of the formula (1) can be obtained by continuating the accumulation during 64 periods of the clock pulse $\phi_0$. A clear signal $\overline{ACCLR}$ for the accumulator 16 becomes "0" every 64 periods of the clock pulse $\phi_0$ as shown in FIG. 3 and clears contents of the accumulator 16 when it rises. The output of the accumulator 16 is applied to a latch circuit 17 which constitutes the resampling device 7. A latch pulse $\overline{LP}$ of the latch circuit 17 is generated at a timing similar to that of the clear signal $\overline{ACCLR}$, latching contents of the accumulator 16 at its rising. Adjustment of the latch timing with the clear timing is made by a known technique so that the accumulator 16 is cleared after the contents of the accumulator 16 have surely been latched by the latch circuit 17. The low-rate sampling frequency of 50 kHz is used as frequencies of the latch pulse $\overline{LP}$ and the clear signal $\overline{ACCLR}$.

The latch circuit 17 has a function of resampling the output tone signal of the digital filter 8 in accordance with the low-rate sampling frequency of 50 kHz and also a function of latching an accumulated value (a filter output value of one sample point) of the accumulator 17. As will be apparent from the foregoing description, the digital filter 8 performs a filter operation for one sample point by spending 64 periods of the clock pulse $\phi_0$, i.e., 16 periods of the high-rate sampling, i.e., one period of the low-rate sampling. Accordingly, the filter output is obtained not at each sample point of the high-rate sampling but every 16 sample points thereof in a skipping manner. No inconvenience, however, is caused by this arrangement, for the resampling in the latch circuit 17 has only to be performed in a skipping manner every 16 sample points and the filter output has only to be obtained at a sample point required for effecting this resampling. It is of course possible to obtain a filter output at each sample point by modifying the device in such a manner that speed of the time division operation of the digital filter 8 is increased or, conversely, providing plural multipliers 9 in correspondence to the respective delay stages and resample this filter output in a skipping manner in accordance with the low-rate sampling frequency.

For better understanding of the invention, an example of signals appearing in some parts of the circuit shown in FIG. 2 are shown in FIG. 3. In the figure, A, B, C and D represent sample values $x_n$ or $x_{n-i}$ of the tone signal applied to the "3", "0", "1" and "2" inputs of the selector 13 and E represents the sample vlaue provided by the selector 13. H represents the coefficient $h_i$ read out from the coefficient ROM 14 in correspondence to this E. G represents the output of the latch circuit 17, i.e., the filter controlled digital tone signal Z which has been converted to the low-rate sampling frequency.

For further understanding of the invention, examples of the waveshape and frequency characteristics of the tone signal are illustrated.

Figure 4:
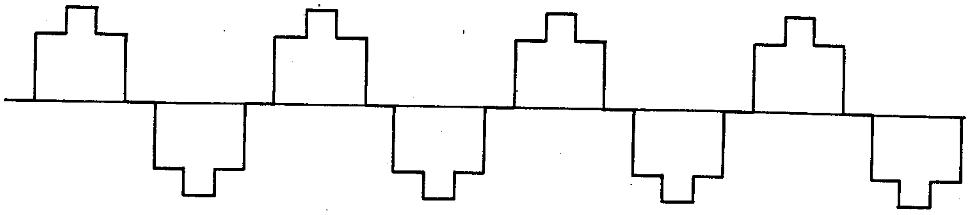
FIG. 4 is a waveshape diagram showing an example of a digital tone signal supplied at a high-rate sampling frequency.
Figure 5:
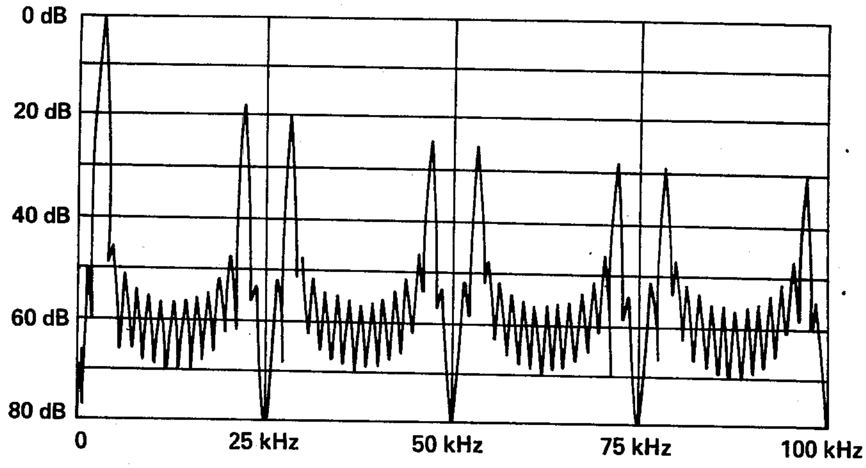
FIG. 5 is a diagram showing frequency component characteristics of the waveshape shown in FIG. 4.
Figure 6:
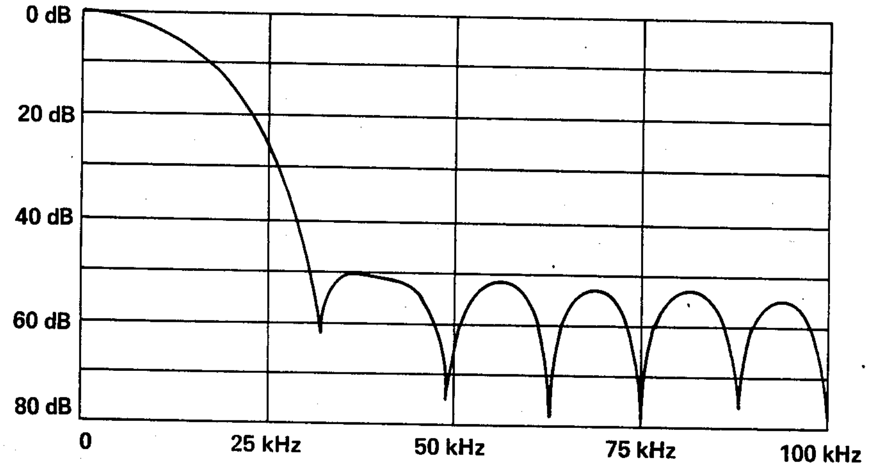
FIG. 6 is a diagram showing low-pass filter characteristics realized by the digital filter of FIG. 2.
Figure 7:
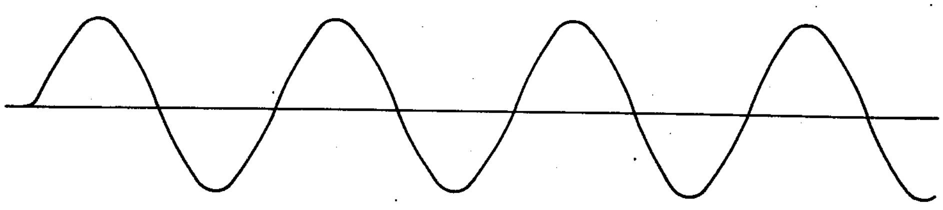
FIG. 7 is a diagram showing a waveshape obtained by filter controlling the waveshape of FIG. 4 with the low-pass filter characteristics of FIG. 6.
Figure 8:
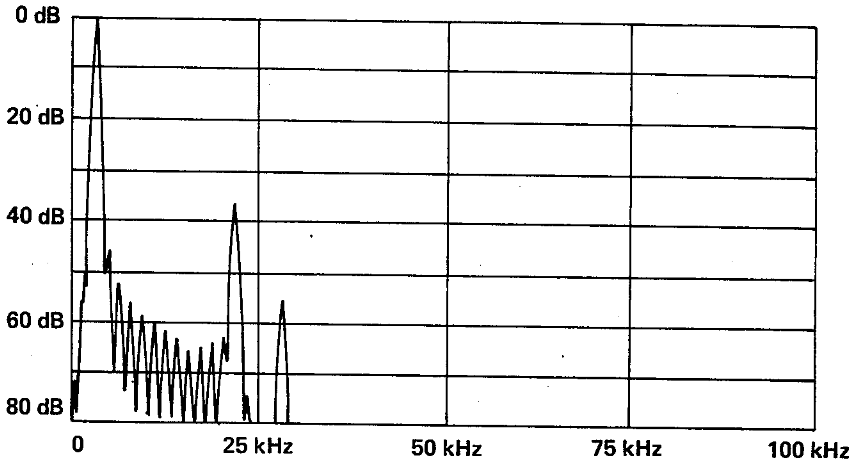
FIG. 8 is a diagram showing frequency component characteristics of the waveshape of FIG. 7.
Figure 9:
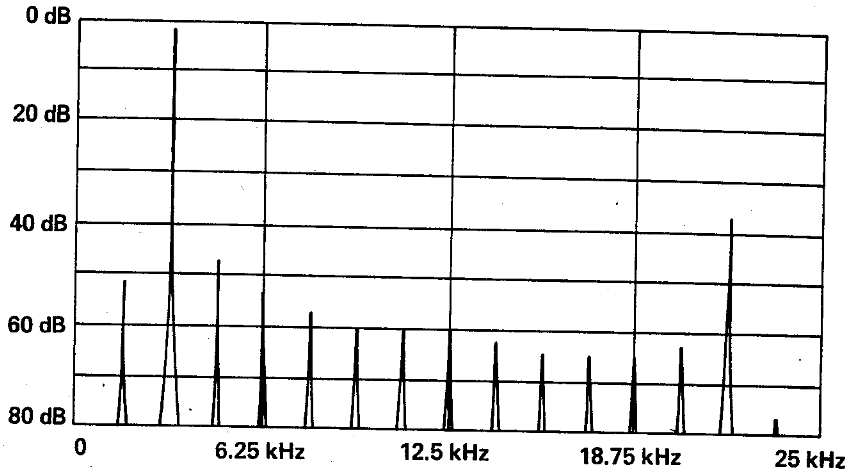
FIG. 9 is a diagram showing frequency component characteristics of a waveshape obtained by resampling the waveshape of FIG. 7 with a low-rate sampling frequency.
Figure 10:
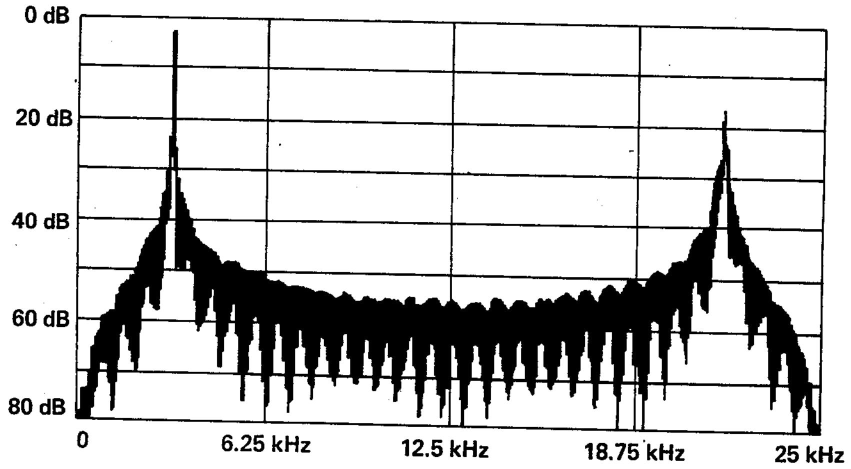
FIG. 10 is a diagram showing frequency component characteristics of a waveshape obtained by resampling the waveshape of FIG. 4 with a low-rate sampling frequency without a filtering process.

FIG. 4 is a waveshape diagram showing an example of the digital tone signal supplied in accordance with the high-rate sampling frequency of 800 kHz. FIG. 5 is a diagram showing frequency component characteristics of the waveshape shown in FIG. 4. In FIG. 5, all frequency components are not shown due to the limitation in illustration and it should be understood that components exist even in a high frequency region over 100 kHz. FIG. 6 shows low-pass filter characteristics realized by the digital filter 8 consisting of an FIR filter of 64 stages with its cut-off frequency being set at 25 kHz. A waveshape obtained by passing the waveshape of FIG. 4 through the digital filter 8 of the low-pass filter characteristics of FIG. 6 is shown in FIG. 7. Frequency component characteristics of the waveshape of FIG. 7 are shown in FIG. 8 from which it will be noted that components below 25 kHz have substantially been cut off. Frequency component characteristics of a waveshape obtained by resampling the waveshape of FIG. 7 with the low-rate sampling frequency of 50 kHz are shown in FIG. 9. It will be seen from FIG. 9 that the waveshape has no aliasing noise but consists only of harmonic components. For the sake of comparison, frequency component characteristics of a waveshape obtained by resampling the waveshape of FIG. 4 at the low-rate sampling frequency of 50 kHz without using the filter are shown in FIG. 10. The black beard-like portions are crowded frequency components caused by an aliasing noise.

The digital filter employed in the present invention is not limited to the above described FIR filter of 64 stages but any type of filter including an FIR filter of other number of stages or an IIR filter (infinite impulse response filter) may be used.

The above embodiment has been described with respect to the example in which the high-rate sampling frequency of 800 kHz is converted to the fixed low-rate sampling frequency of 50 kHz. Relationship between the high-rate frequency and the low-rate one is not limited to this but other ratio may be selected as desired. The low-rate sampling frequency for the resampling is not limited to a fixed one but may be one which varies with time for producing a modulation effect.

The tone signal generation means is not limited to a polyphonic type device but a monophonic type device may also be employed. The invention is applicable not only to a device including the pitch synchronous type tone signal generation means but to any device in which the high-rate sampling frequency is converted to a low-rate sampling frequency.

According to the invention, a digital tone signal of a high-rate sampling frequency is converted to one of a low-rate sampling frequency after passing the digital tone signal through the digital filter 8 and an aliasing noise thereby can be removed with respect to the low-rate sampling frequency. Accordingly, the invention is useful in a case where a modulation effect device in which an input tone signal is required to be of a relatively low-rate sampling frequency is added to the electronic musical instrument, for coupling of the devices is realized without causing the problem of aliasing noise.

What is claimed is:

1. An improved electronic musical instrument comprising:

clock means for providing a relatively high frequency clock signal having an associated clock period;

tone signal generation means for providing a first digital tone signal having a first sampling frequency four times as high as said clock frequency, corresponding to 64 sample points per cycle of the digital tone signal, and having an associated first sampling period;

a digital filter for receiving said first digital tone signal and filtering out substantially all frequencies above a predetermined cutoff frequency, said digital filter comprising:

first, second and third delay circuits, coupled in series and providing first, second and third delayed digital tone signals, respectively, said first delay circuit receiving said first digital tone signal, each delay circuit having 16 stages each stage delaying said digital tone signal by one first sampling period, each said delay circuit thereby delaying said digital tone signal by 16 first sampling periods;

a selector circuit coupled to said tone signal means, said first, second and third delay circuits and said clock means for selecting at every clock pulse one of said first digital digital tone signal and said first, second and third delayed digital tone signals and providing such selected signal as a selector output signal;

filter coefficient means for providing a predetermined filter coefficient signal every clock period; and a multiplier circuit for receiving said selector output signal and said filter coefficient signal and multiplying said two signals every clock period and providing said multiplied signals as a multiplier output signal;

an accumulator circuit for receiving said multiplier output signal and accumulating said multiplier output signal over 64 clock periods and providing an accumulated multiplier output signal every 64 periods; and sampling means for receiving said accumulated signal and resampling said signals every 16 first sampling periods.

2. A tone signal processing device as defined in claim 1 wherein said digital filter is a finite impulse response filter.

3. A tone signal processing device as defined in claim 1 further comprising first and second sound systems, one of the sound systems coupled to said digital filter and said sampling means and the other sound system coupled to said tone signal generation means, and further comprising digital effect imparting means for digitally imparting a predetermined tone effect to the digital tone signal which has been resampled by said sampling means.

4. A tone signal processing device comprising at least clock means for providing a clock signal having a relatively high frequency and associated clock period, tone signal generation means for supplying a digital tone signal having a plurality of channels and having a first sampling period in accordance with a first sampling frequency corresponding to a specified number of sample points per cycle of the digital tone signal, sand sampling means for resampling said digital tone signal in accordance with a second sampling frequency which is lower than said first sampling frequency, the improvement comprising:

at least one delay means, each having a plurality of stages, for receiving said digital tone signal and delaying said signal by a fixed multiple of said clock period at each stage and each delay means providing a delayed digital tone signal;

selector means for receiving said digital tone signal and said at least one delayed digital tone signal and alternately selecting at each said clock period one of said digital tone signal and said at least one delayed digital tone signal and providing said selected digital signal as a selector output signal, wherein each of said digital tone signal and said at least one delayed digital tone signal are selected once during said first sampling period;

digital filter coefficient means for supplying a digital filter coefficient signal at each clock period;

multiplier means for receiving said selector output signal and said digital filter coefficient signal and providing a multiplied digital signal at each said clock period; and accumulator means for receiving the multiplied digital signal at each clock period and accumulating said received multiplied digital signals during a predetermined number of clock periods and providing said accumulated signal to said sampling means; and wherein said specified number of sample points per cycle corresponds to the ratio of the clock frequency to the second sampling frequency.

5. A tone signal processing device as set out in claim 4 wherein said sampling means comprises a latch circuit.

6. A tone signal processing device as set out in claim 4 comprising four delay means and wherein each said delay means includes sixteen stages and each of said stages delays said digital tone signal by one clock period, and wherein said predetermined number of clock periods is 64.

7. A tone signal processing device as set out in claim 6 wherein said first sampling period corresponds to 4 clock periods and wherein said fixed multiple of said clock period is 16.

8. A tone signal processing device as set out in claim 4 wherein said clock frequency is 3.2 MHz, said first sampling frequency is 800 KHz, said second sampling frequency is 50 KHz, said specified number of sample points per cycle is 64 and said accumulated digital signal is provided at a frequency of 50 KHz.

9. An improved tone signal processing method for processing a digital tone signal having a first sampling period in accordance with a first sampling frequency, comprising the steps:

providing a clock signal having a relatively high frequency and clock period associated therewith;

delaying said signal in a plurality of consecutive stages by a fixed multiple of said first sampling period at each stage and providing a delayed digital tone signal every predetermined number of stages;

alternately selecting one of said digital tone signal and said delayed digital tone signals and providing said selected digital signal as a selector output signal, said selecting operation occurring at each said clock period, and wherein each of said digital tone signal and delayed digital tone signals are selected once during said first sampling period;

providing a digital filter coefficient signal at each clock period;

multiplying said selector output signal and said digital filter coefficient signal and providing a multiplied digital output signal at each said clock period;

accumulating said multiplied digital output signals during a predetermined number of clock periods and providing an accumulated digital signal; and resampled said digital tone signal in accordance with a second sampling frequency which is lower than said first sampling frequency.

* * * * *